(12) United States Patent
Bendix et al.

(10) Patent No.: US 8,763,240 B2
(45) Date of Patent: Jul. 1, 2014

(54) FABRICATION PROCESS FOR EMBEDDED PASSIVE COMPONENTS

(75) Inventors: Lendon L. Bendix, Melbourne, FL (US); Derek A. Turner, Melbourne, FL (US)

(73) Assignee: TFRI, Inc., Melbourne, FL (US)

( * ) Notice: Subject to any disclaimer, the term of this patent is extended or adjusted under 35 U.S.C. 154(b) by 338 days.

(21) Appl. No.: 13/176,168

(22) Filed: Jul. 5, 2011

(65) Prior Publication Data
US 2012/0000064 A1 Jan. 5, 2012

Related U.S. Application Data

(60) Provisional application No. 61/361,200, filed on Jul. 2, 2010.

(51) Int. Cl.
*H05K 3/30* (2006.01)
(52) U.S. Cl.
USPC .................. 29/832; 29/830; 29/840; 29/846; 29/852; 716/100; 716/104
(58) Field of Classification Search
USPC ................................................. 716/100, 104
See application file for complete search history.

(56) References Cited

U.S. PATENT DOCUMENTS

| | | | | |
|---|---|---|---|---|
| 4,642,160 | A | * | 2/1987 | Burgess .......................... 216/18 |
| 6,103,992 | A | * | 8/2000 | Noddin ..................... 219/121.71 |
| 6,130,015 | A | * | 10/2000 | Noddin et al. ................... 430/22 |
| 6,496,957 | B1 | * | 12/2002 | Kumagai ....................... 716/112 |
| 7,318,214 | B1 | | 1/2008 | Prasad et al. |
| 7,350,175 | B2 | * | 3/2008 | Iwaki et al. .................... 716/115 |
| 7,676,920 | B2 | | 3/2010 | Farkas et al. |
| 7,703,064 | B2 | * | 4/2010 | Ashida et al. ................. 716/137 |
| 2005/0190959 | A1 | | 9/2005 | Kohler et al. |
| 2007/0079276 | A1 | * | 4/2007 | Ashida et al. ................... 716/15 |
| 2007/0250522 | A1 | | 10/2007 | Perrizo |
| 2008/0251940 | A1 | | 10/2008 | Lee et al. |
| 2009/0044403 | A1 | | 2/2009 | Fauh et al. |

OTHER PUBLICATIONS

Neural Network Approaches to Electro-Magnetic Modeling of Passive Components and their Applications to High-Frequency and High-Speed Nonlinear Circuit Organizations by Ding et al (IEEE Trans. of Microwve Theory & Techniques, vol. 52, No. 1,Jan. 2004.*
Neural Network Based Modeling Technique for Modeling Embedded Passives in Multilayer Printed Circuits by X. Ding, M.S. Dissertaion , Carlton Univ. Ottowa, Canada, ( 2002).*

* cited by examiner

*Primary Examiner* — Carl Arbes
(74) *Attorney, Agent, or Firm* — Greenberg Traurig LLP (57) ABSTRACT

A fabricating process for a multi-layer printed circuit board containing embedded passive components is provided. The method includes a calibration step wherein a calibration measurement is taken of the geometry or at least one electrical parameter of an arrangement of calibration test points for a circuit forming process, such as masking, etching and/or lamination. A process control step is performed during the process, wherein a process control measurement is taken of at least one electrical parameter at one or more process control test points along one or more axes outside areas in which a circuit is to be formed. An analysis is performed of at least the calibration measurement and the process control measurement to calculate a CAD geometry change required to improve precision of embedded passive components to be printed on the multi-layer printed circuit board. The CAD geometry is modified in accordance with the calculated CAD geometry change, and multi-layer printed circuit boards containing embedded passive components are manufactured in accordance with the modified CAD geometry. The analyzing step may model variability and adapt to it.

26 Claims, 8 Drawing Sheets

Top View

Section View (Enlarged)

FABRICATION PROCESS FOR EMBEDDED PASSIVE COMPONENTS

This application claims priority to U.S. Provisional Patent Application No. 61/361,200 filed Jul. 2, 2011, the entire disclosure of which is incorporated herein by reference.

This application includes material which is subject to copyright protection. The copyright owner has no objection to the facsimile reproduction by anyone of the patent disclosure, as it appears in the Patent and Trademark Office files or records, but otherwise reserves all copyright rights whatsoever.

FIELD

The present invention relates in general to the field of embedment of passive components in printed circuit boards, and in particular to a method for fabricating multi-layer circuit boards with embedded passive components.

BACKGROUND

Embedding passive components into circuit boards was developed as a way to decrease electronic size and improve performance. Circuit boards with embedded passive components optimize layout in all three dimensions, allowing more efficient use along the thickness of the board to decrease volume. Improved performance comes by way of shorter and more electromagnetic interference isolated connections between components. In addition to decreased size and increased performance, embedded passives decrease assembly steps required to connect components to the surface of the card and thus cost.

One customary practice for designing embedded passive components involves utilizing published embedded material properties. For example, sheet resistance may be given as 25 ohms per square (ohms/sq) while capacitance may be given as 1 nanofarad per square centimeter. These material specifications are commonly accompanied by upper and lower quality control limits, giving 25 ohms/sq a plus five percent and minus five percent variation, as an example. With this information, designs for embedded passives are set by defining the geometry such as the length and width of the material. Component length, width, and sheet resistance define resistance for an embedded resistor. That is to say, the resistance is the product of the sheet resistance and the ratio of length to width.

With lengths and widths defined, embedded component manufacturers are able to start the construction of a circuit board. Typically, a circuit board will have a structural dielectric base with a thin conductive copper foil attached. A circuit card with embedded components may also include a coating of electrodeposited metal such as nickel alloy on the conductive copper which would reside between the copper and base dielectric layers. Embedded components are formed as printed wires or traces by selectively etching the thin metal foil. For embedded components, that may include both metal layers of copper and nickel alloys. A multi-layer board is created by laminating this construction to other base dielectric layers with copper foil attached and bonded by way of heat and pressure and prepreg glue. Access of surface mounted components to embedded ones is by way of vias which are conductive barrels inserted into holes drilled through the various board layers. Vias attach conductive surface patches to embedded ones such as those from an embedded resistor.

The manufactured embedded passive board assembly is verified by measuring with a meter between vias exposed to the surface of the board and attached to embedded components. Utilizing the conventional manufacturing process described, the resistors in this example would not fall within the specified five percent control limits. This is primarily for two reasons; one, the way in which the material control limits are specified by the manufacturer; and two, the variations associated with the board manufacturing process.

In response to the two sources of undesirable process control, board manufacturers employ a corrective mechanical or laser trimming procedure accompanied by computer aided design geometry correction factors and quality control test points. Quality control test points are utilized as a means of further refining the manufacturers specified sheet resistance. Commonly specified values lack two items, statistical confidence levels on upper and lower control limits, and the minimum area in which sheet resistance is controlled within those limits with a particular confidence level. The smaller the area, the statistically less the likelihood that the sheet resistance will fall within control limits. To combat this, large embedded components, such as resistors, may be etched in handling areas of a laminate sheet. The resistors are large to offset local sheet resistance effects and variations associated with etching the geometry. The larger the resistor, the less probability a deviation in length to width ratio has on final resistance. These quality control resistors are measured, may be averaged, and compared to the manufacturers control limits. They provide a go/no go quality control checkpoint prior to etching any other embedded component. The problem associated with this checkout procedure still lies in the fact that the resistors are standardize to a set size to meet the manufacturers embedded material control limits restraining the size of the components.

Etching variations in the manufacturing process are tuned by way of computer aided design (CAD) or computer aided manufacturing (CAM) changes. Generally, board fabricators will make global changes to the received geometry component design to offset process variability in etching. Prior to etching, an etchant mask is placed down on the copper or nickel alloy material to protect areas where etching is not to occur. These areas may be increased to account for undesirable etching that occurs at the mask extents. Increases are made by way of CAD prior to placing the mask. These global changes, however, do not account for variations in etching that occur horizontally and vertically across the board. Like the embedded material, control points in the etching process are dictated by how they are averaged out over the entire surface area of the board.

Corrective trimming, by way of laser or mechanical means, is the third tool currently employed to reduce process and material variations issues. Prior to bonding etched layers of the circuit board together thus encapsulating components, embedded passive geometry is adjusted by removing resistive material such as nickel alloy. This allows for unidirectional adjustment in resistance thus limiting corrections to only increasing resistance. Making use of trimming requires CAD adjustments in component geometry to account not only for the unidirectional limitations of trimming process, but also for changes that occur when the board is exposed to heat in pressure during the lamination process.

Figure 1A:
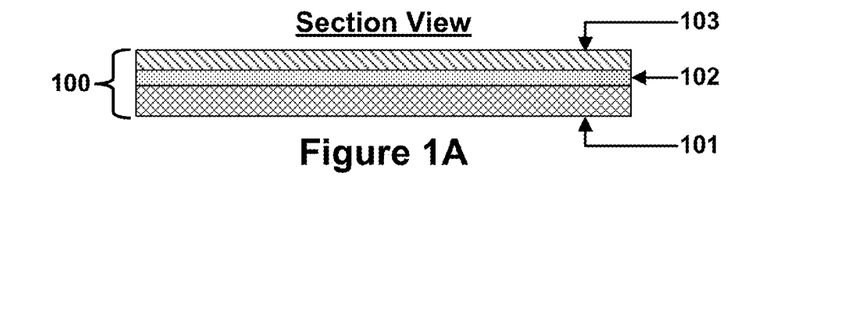
FIGS. 1A-1F show the conventional fabrication process for embedded passive components
Figure 1B:
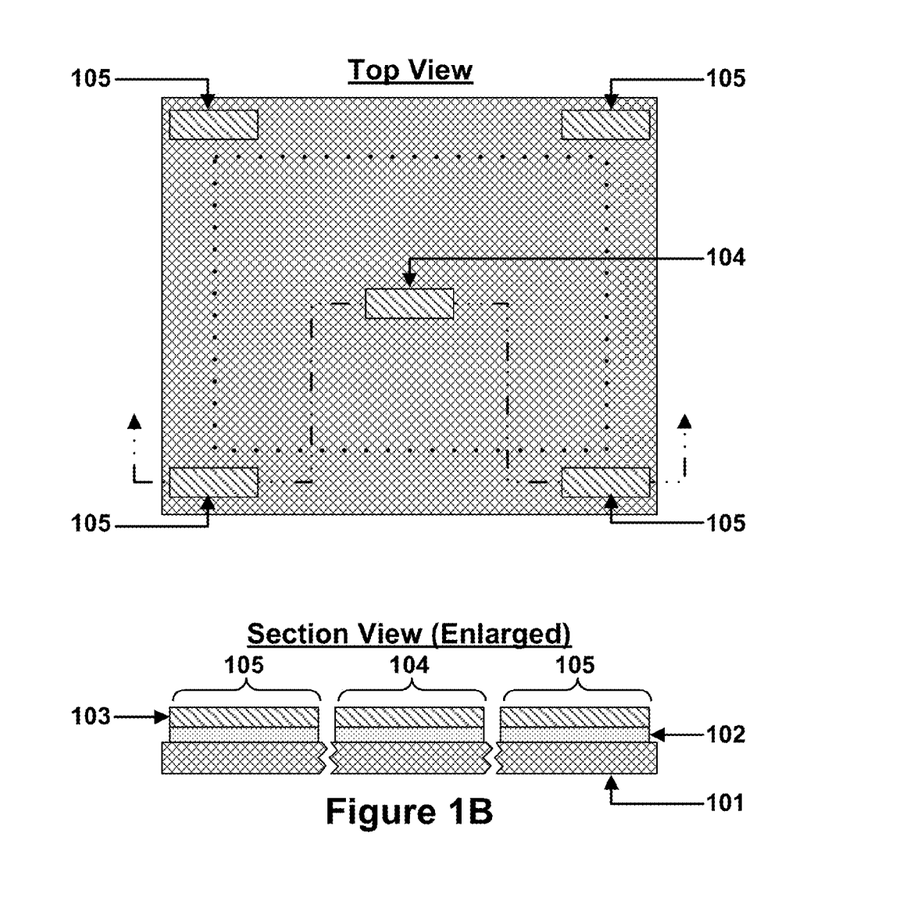
Figure 1C:
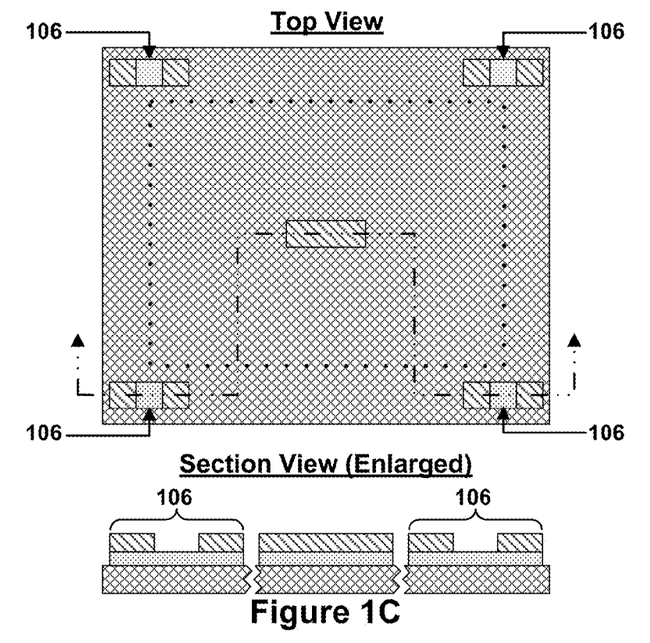
Figure 1D:
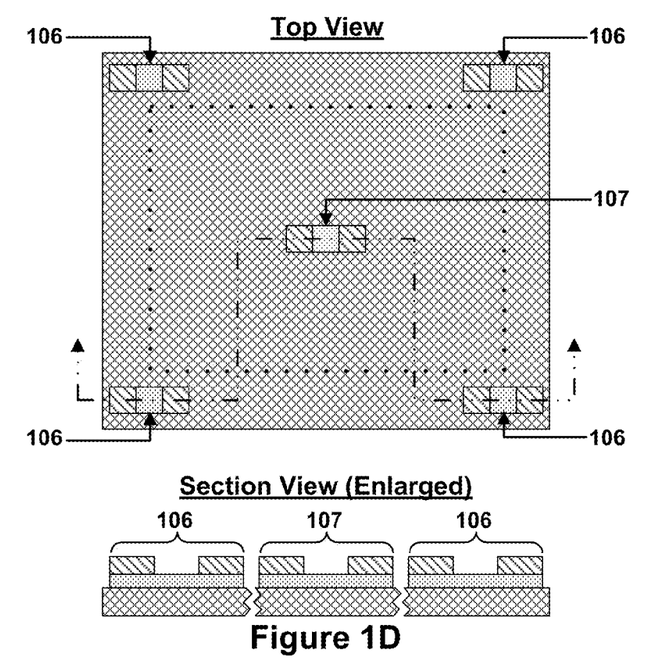
Figure 1E:
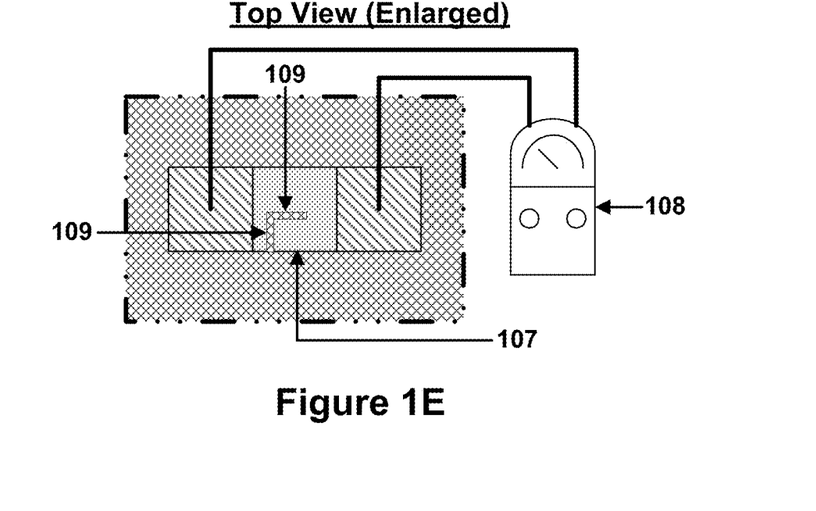
Figure 1F:
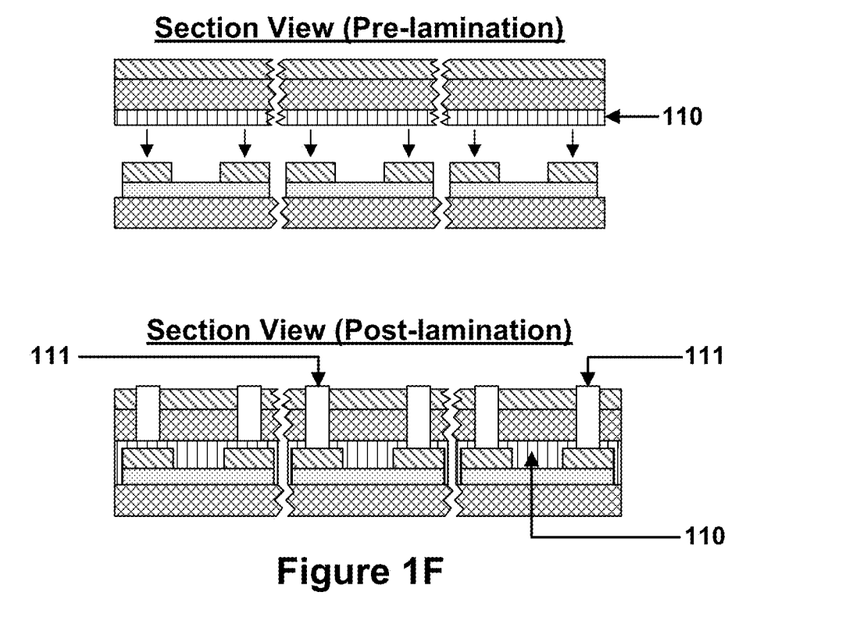

A conventional embedded passive circuit card process will be described first to serve as a building block of understanding the invented procedure. This process is illustrated in FIGS. 1A through 1F. The manufacturer starts with a composite laminate, 100, made up of a dielectric layer, 101, a passive component layer, 102, and a conductive layer, 103, as shown in FIG. 1A. The dielectric layer is typically made up of a composite structure such as woven glass but can be any other material known in the art. The passive layer is typical comprised of resistive material, such as nickel alloy, for fabricating resistors or inductors, or a capacitive material for constructing capacitors.

The etching process starts with the application of a mask to a circuit board. The mask allows the outline of the desired design resistors, 104 shown in FIG. 1B, necessary quality control resistors, 105, to be formed by two etching steps. The CAD layout for the masking may be globally modified to offset for average etching variations across the board. The first etching step removes selective conductive layer material while the second removes selective passive layer material. The composite laminate is rinsed leaving the outlines of the resistors. A second mask is printed protecting everything from etchant except select portions of the quality control resistors. Copper is again etched away and the board is rinsed of its mask leaving the quality control passive components, labeled 106 in FIG. 1C, complete and ready for inspection. In the case of resistor components, resistance is measured and compared against passive material published control limits. If the inspect points are in compliance to the published data, a final masking and etching step is performed leaving the intended design passive component formed, 107 in FIG. 1D and ready to be tested.

At this point, the iterative trimming process starts. While this process may be automated, it is still very time consuming and costly. The design component, a resistor for example, is measured, 108 in FIG. 1E, to determine to resistance at this point of the process. Multiple measurements and trims, 109, are made until the resistor is within the desired range. This desired range may not be the ultimate end desired resistance as the component will be exposed to heat and pressure during the lamination process, FIG. 1F. Changes can be expected to occur and must be accounted for when the board is bonded with prepreg glue, 110. Vias, 111, are added to allow access to the embedded component from the top surface.

The current process describe in FIGS. 1A-1F employs CAD geometry corrections and quality control resistors in an attempt to minimize the effect material and process related variations have on the fabricated embedded component tolerance. The components, as for the case of embedded resistors, must be sized in the CAD in a manner that allows them to be lower in resistance, as the trimming procedure can only increase resistance. Trimming, performed prior to lamination process, must also account for the additional change the components will experience under heat and pressure during bonding.

Employing the current tools described above to tighten the control limits of embedded passive components offsets cost and performances advantages over their surface mounted counterparts. Laser trimming is an iterative procedure requiring multiple measuring and trimming steps to bring components within compliance. Trimming results in lower embedded component circuit yield and added cost. Trimming also decreases the likelihood the components will be successfully employed in high frequency electronic circuits. This is because trimming introduces variability in the current flow path and to the material itself. So while end component tolerance may be significantly decreased, cost is increased and applications are typically limited to low frequency applications.

SUMMARY

In light of forgoing, there exists a need to improve the manufacturability of embedded passives. There is also a need to adapt to the variability of embedded materials and board fabrication processes. There is further a need to reduce cost and enable embedded passive use in high frequency applications. The processes in the current invention refine both the geometry changes made in the CAD and quality control procedures to eliminate the costly laser trimming procedure.

In an embodiment, the disclosed methods provide a fabricating process for a multi-layer printed circuit board containing embedded passive components. The method includes a calibration step wherein a calibration measurement is taken of the geometry or at least one electrical parameter of an arrangement of calibration test points for one or more circuit forming processes, such as masking, etching and/or lamination. A process control step is performed during the process, wherein a process control measurement is taken of at least one electrical parameter at one or more process control test points along one or more axes outside areas in which a circuit is to be formed. An analysis is performed of at least the calibration measurement and the process control measurement to calculate a CAD geometry change required to improve precision of embedded passive components to be printed on the multi-layer printed circuit board. In an embodiment, the analyzing step utilizes initial CAD geometry, measured mask geometry, and measured etched resistor geometry. The CAD geometry is modified in accordance with the calculated CAD geometry change, and multi-layer printed circuit boards containing embedded passive components are manufactured in accordance with the modified CAD geometry. The analyzing step may model variability and adapt to it using a learning model such as a neural network model. The neural network model can learn process and material variations, such as embedded passive material granular variation, etching process variation, lamination stretching effects, and the verification system.

The following is a non-limiting example of an overall process for practicing the invention. In fabricating a printed wiring board, various steps introduce process-related errors including those from test equipment used in verification. The first involves the generation of embedded component masking which is derived from CAD information. The calibration of the masking step involves quantifying the variability between CAD geometry and the actual printed mask across the surface of the board. For this step, arrangements of shapes, square resistors for example, are generated in the CAD tool. The square shaped mask is applied across the board area and the dimensions are measured and stored for a later analysis.

The manufacturing and calibration process continues with etching. Shapes are formed by the etching away of copper and nickel alloys leaving an exposed resistor. This etching process, like the masking procedure, is measured to quantify variability between etch geometry and mask and CAD geometry, and stored for later analysis.

With a collection of embedded resistors, capacitors, or inductors being formed, the board is laminated to the remaining layers typically under heat and pressure with a prepreg bond. Holes are drilled into the circuit card and vias are added to provide access to the embedded passive parts. An electrical parameter such as resistance, capacitance, or inductance is measured for the components across the area of the board and saved for a later analysis. This procedure marks the completion of the calibration step. Calibration may be performed again to account for changes introduced to the manufacturing process such as equipment replacement or for recalibration efforts.

The process control step includes utilizing one or more process control test points along one or more axes outside areas in which a circuit is to be formed. Typically this area is used for handling and quality control purposes. From the process control test points, at least one electrical parameter is measured. The process control step occurs during the etching process. The etching process utilizes multiple prints of a mask to complete embedded passive components. For example, resistor outlines are first formed for both end design and quality control resistors or in this case a series of process control resistors along horizontal and vertical axes outside the area where the circuit is to be formed. Only two strips are required on the bottom and right hand side. If a more accurate response is needed the strips can be placed at the top and bottom as well both sides. Both copper and resistive nickel alloy are etched. Next, a mask is printed in a manner that allows copper to be etched only from the process control resistors, leaving the design resistors outlines intact. An electrical parameter such as resistance is measured from the process control resistors and this information is combined with the calibration information for analysis.

The analysis is utilized to change the CAD geometry of the design resistors. In particular, the final mask print or square cutout areas, for etching copper away in the outlines of the previously etched design resistors. This leaves exposed resistance material between copper access patches to form the resistor. The analysis utilizes both the calibration and process control information to account for material variability, mask and etchant variability, and the final lamination process variability across the circuit board. The analysis models variability and adapts to it. The model continues to learn and improve with each assortment of boards created as information from process control test points and the normal component verification procedure after lamination is fed into it.

BRIEF DESCRIPTION OF THE DRAWINGS

The foregoing and other objects, features, and advantages of the invention will be apparent from the following more particular description of preferred embodiments as illustrated in the accompanying drawings, in which reference characters refer to the same parts throughout the various views. The drawings are not necessarily to scale, emphasis instead being placed upon illustrating principles of the invention.

DETAILED DESCRIPTION

Reference will now be made in detail to the preferred embodiments of the present invention, examples of which are illustrated in the accompanying drawings.

Figure 2A:
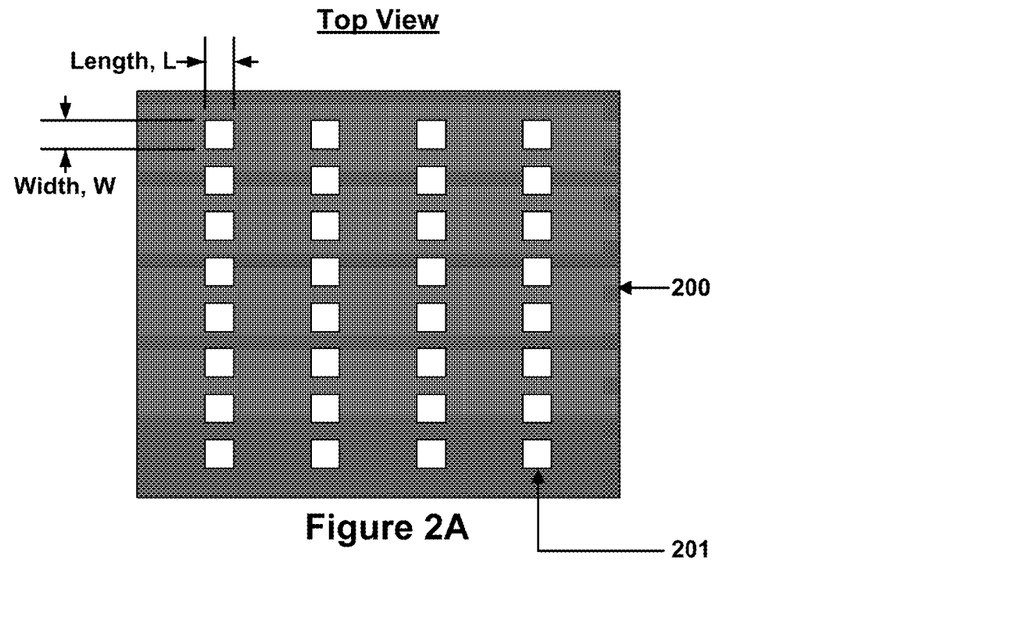
FIGS. 2A-2C show the calibration process steps for the refined approach to manufacturing embedded passive components
Figure 2B:
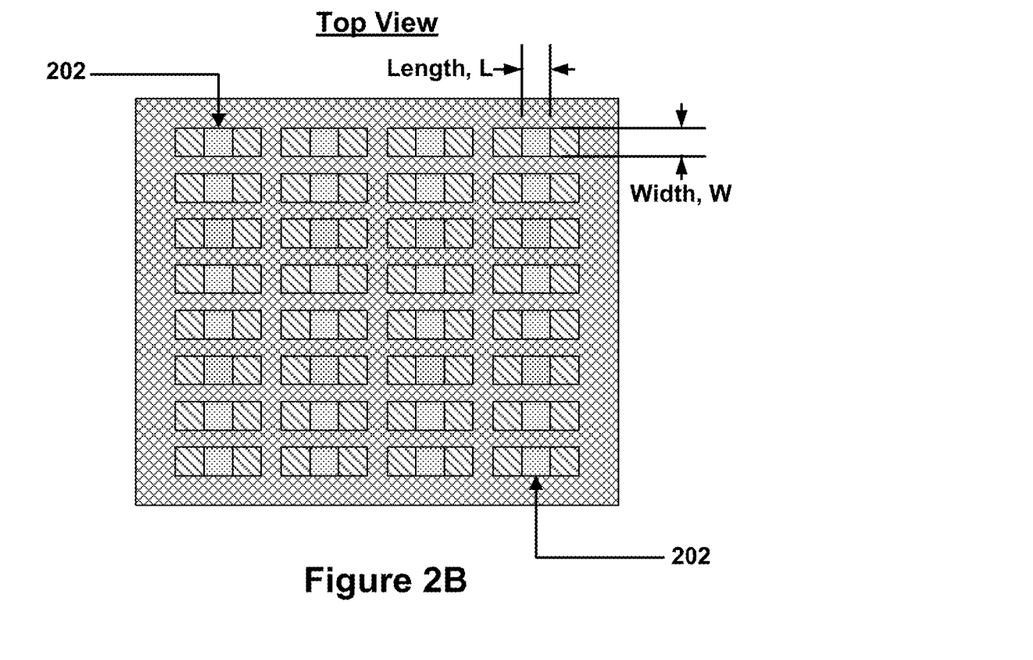
Figure 2C:
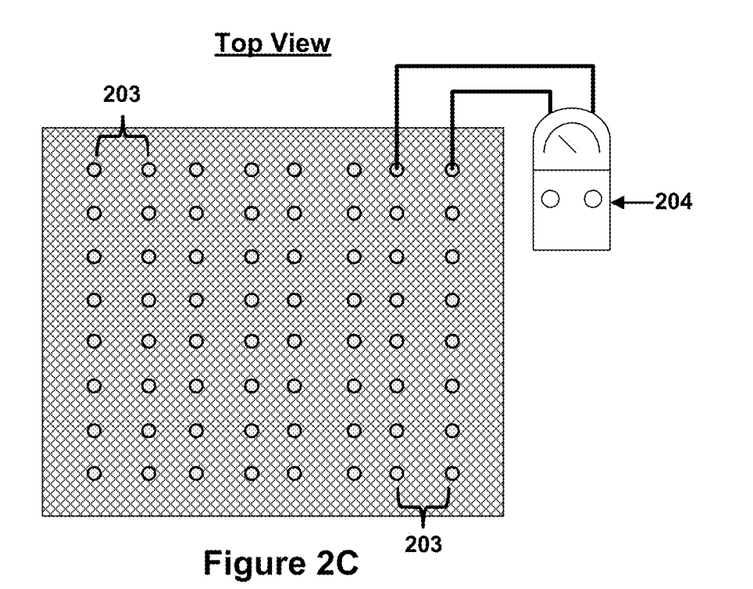

The current invention can be broken into two portions, a calibration portion, shown in FIGS. 2A-2C, and a quality or process control portion, shown in FIG. 3A-3D. The calibration portion starts with FIG. 2A. Using the same laminate construction, 100, shown in FIG. 1A, outlines of components are etched into the board using the same process shown in FIG. 1B. In this case, an assortment of components are etched across the laminate instead of one used to previously describe the current manufacturing process. A second mask, 200, shown in FIG. 2A is printed onto the laminate resulting in the final areas to be etched, 201, for the resistors. The geometry, length, L, and width, W, in this example are measured across the board. The actual geometry is not limited to the squares shown and may be any shape that allows for the comparison of CAD geometry to resulting mask geometry.

With the mask in place, the final etching of the resistors, 202, is completed as shown in FIG. 2B. Like the mask, the geometry of the etched components is measured for comparison purposes between CAD and mask geometry. All three pieces of information, the CAD geometry, the measured mask geometry, and the measured etched resistor geometry are stored for analysis to be described later. The board is then laminated as described previously in FIG. 1F with holes drilled and vias added completing the build of the final circuit board shown in FIG. 2C. The last step of the calibration process utilizes a current verification test step of the final product. The embedded components, 203 are measured using any of various types of meter, 204, such as an ohmmeter for resistance, and stored for a later analysis. The calibration process described is not limited to masking, etching, and lamination processes, but any procedure that may introduce variations into the final product. It is also not limited to geometry measurements and may include the recording of an electrical parameter, such as resistance, after the final etch.

Figure 3A:
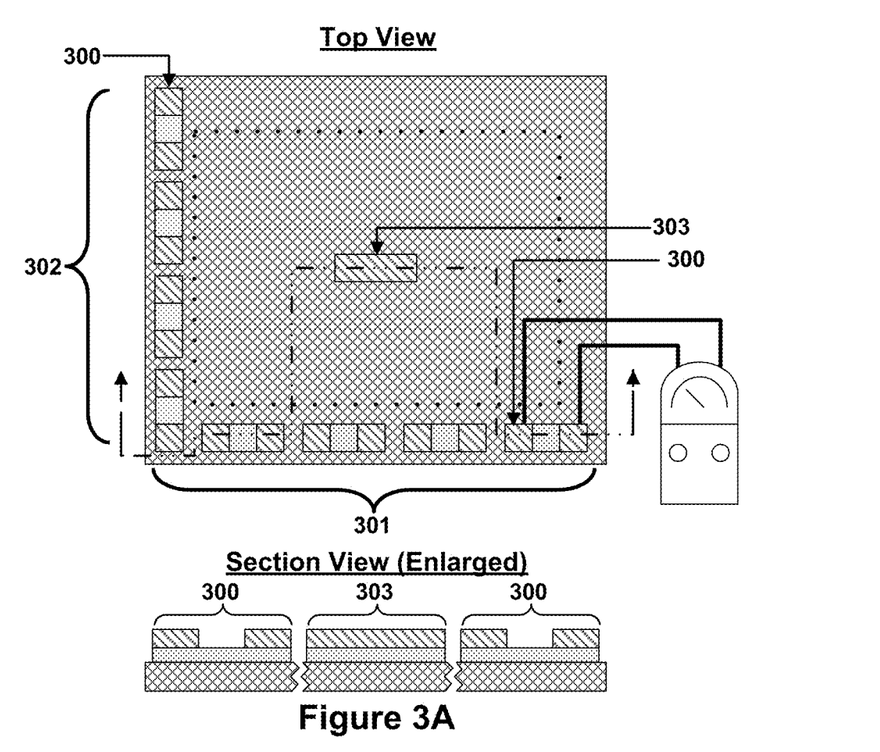
FIGS. 3A-3D show the refined process control procedure and its application along with calibration towards masking for embedding passive components inside a circuit card.
Figure 3B:
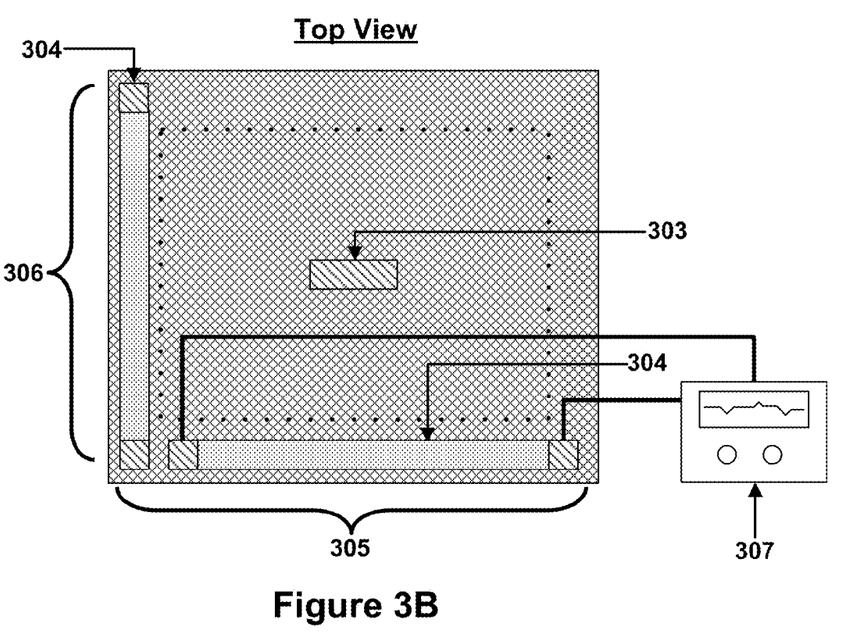

Upon the conclusion of the calibration portion, the process control portion is utilized in the making of future circuit cards with embedded components. Actual fabrication of the circuit card with embedded passives starts with the same structured laminate of the conventional process shown in FIG. 1A. Outlines for both design and process control components are fabricated using the same masking and etching procedures of the conventional process shown in FIGS. 1B-1C. The difference, however, is a series of quality or process control components, 300, are fabricated along one or more axes, two in this example shown in FIG. 3A, along the horizontal, 301, and vertical, 302, axes. These axes are placed outside the area in which the circuit is to be formed, an area typically used for handling an array of circuit boards or quality control purposes. With the series of process components complete, an electrical parameter is measured, such as resistance, from each one to be utilized in conjunction with the calibration data in analysis. This analysis will be utilized to change the CAD geometry of the design component, 303. An alternative to a series of components, resistors in this case, would be a single horizontal, 305, and vertical, 306, resistor as shown in FIG. 3B. An electrical parameter may be measured with a time or frequency domain reflectometer, 307. The means to obtain this information are not limited to these two examples, a series or single component, but any means that can be used to model variations across the laminate.

Figure 3C:
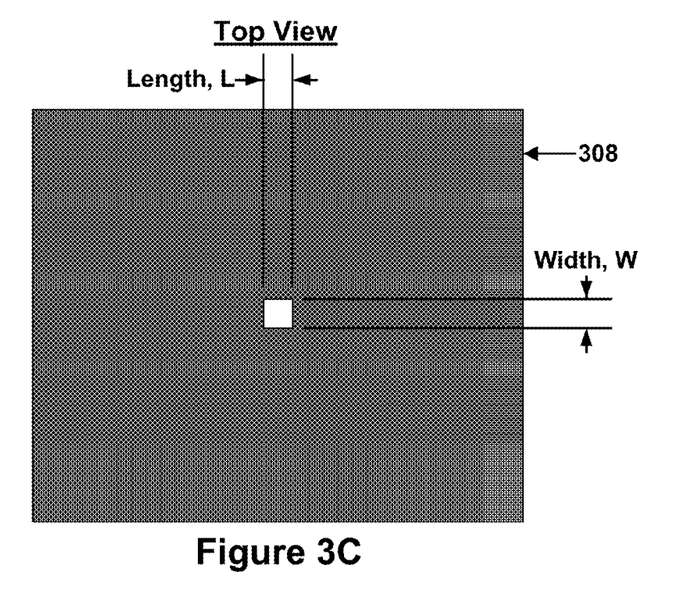
Figure 3D:
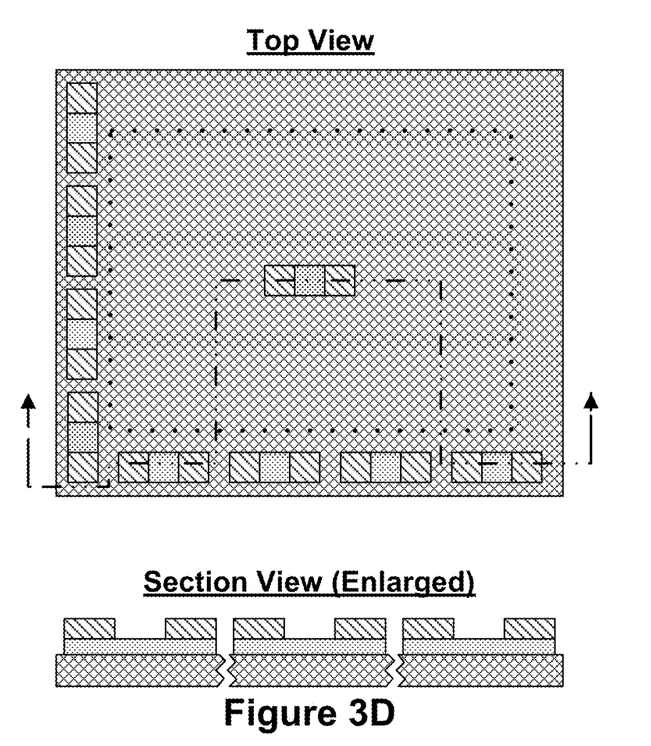

The information from the calibration and process control portions is utilized in an analysis to determine the proper size of the final mask, 308, of the design resistor as shown in FIG. 3C. In particular, length, L, and width, W, for the case of a square component is determined. The laminate with the etched design component, as shown in FIG. 3D, is bonded to the remaining layers of the circuit board like that shown in FIG. 1F. A final checkout of the components is performed to validate that the manufacturer has met the intended design requirements such as desired resistance or capacitance within control limits. This information is also utilized to improve future embedded passive circuit board builds by way of a learning model.

A learning model, or neural network, is an adaptive, statistical data modeling tool that models relationships between input and outputs. Relationships in this case could be variations in material properties or process related control limits across the circuit card. The example described in FIGS. 1-3 include material sheet resistance variation and mask, etch, and lamination geometry changes. In defining these discrete variations across the laminate, the neural model may use a linear regression analysis and/or stochastic processing analysis. For example, matrix and linear algebra may be used to determine the gradient and variation along the panel. This is unlike the traditional method which uses an average to compute control limits as is the case with the quality control components in the corners of the outlying handling areas of the laminate. A C Sharp program using matrix linear algebra and adaptive filtering can be utilized to determine the material variation across the panel in seconds.

The above can also be done with the etching process. Etching variation is adjusted for in CAD globally to account for an average variation across the board. Likewise, prior to lamination, the components may be trimmed to undersize their values globally to account for an average increase in resistance for the case of embedded resistors.

Figure 4A:
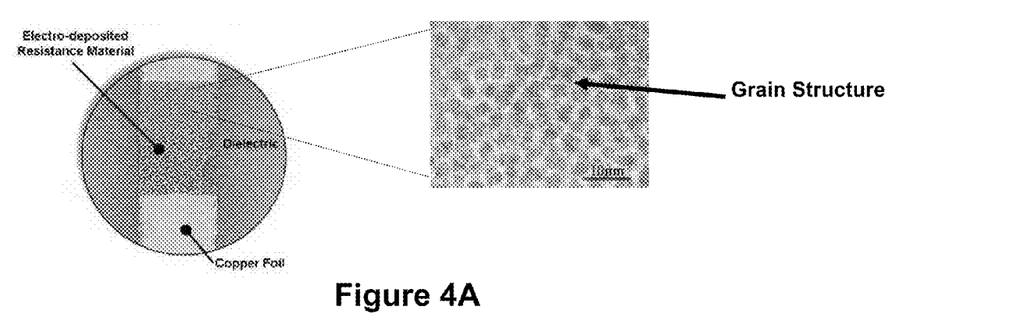
FIGS. 4A-4B show examples of variations that the learning model can learn, including embedded passive material granular variation and etching process variation.
Figure 4B:
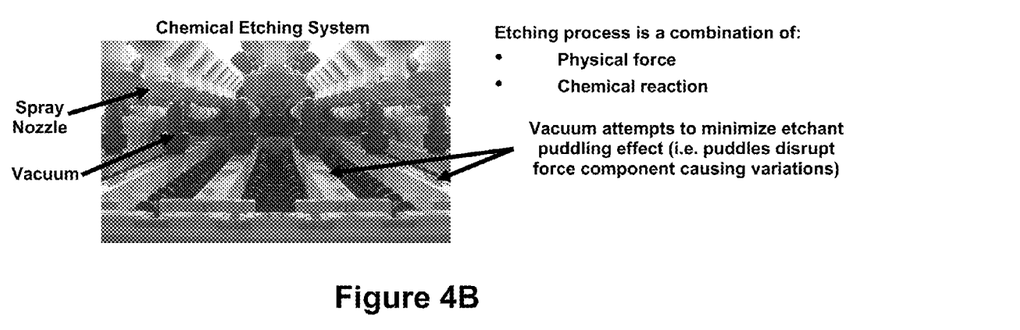

As illustrated in FIGS. 4A and 4B, the neural model can learn the embedded passive material granular variation and etching process variation such as puddle effects, etch undercut, spray pattern obstructions. The neural model can learn any other material or process variation, including lamination stretching effects as a result of thermosetting pre-impregnation material setting and leaving embedded passive material longer, wider, and thinner, thus shifting resistance. The neural model can learn the verification system wherein embedded passive components are electrically measured.

By modeling variations in all of these factors across the entire surface of the laminate, final component tolerances are reduced. As will be appreciated by those skilled in the art, a variety of different models can be used for implementing a neural analysis described herein to reduce embedded passive component tolerance.

Likewise, it should be understood that the invention described herein can be implemented by alternative means of collection of calibration data for distinct procedures for the purpose of understanding variations across the laminate. It should be further understood that alternate means of collection of process control data on each build in locations outside areas where a circuit is to be formed for the purpose of understanding material property variations across the laminate can be implemented. Lastly, it is understood that alternatives to a neural network exist that could utilize both calibration and process control information to reduce embedded passive tolerances.

Using the present process in one embodiment, resistors are etched on the side and bottom of the panel. The copper protects the material below the copper with very little chemical variations affecting the embedded material itself. With a long strip of copper on the bottom and side, only square or rectangular resistors are etched into the copper strip to expose the embedded passive material. The copper is still protecting the material under it that is connecting the etched areas of the embedded passive material. This leaves the material continuous across the strip. Since the rectangular and square resistors are large enough, the value of the final etched resistor is a function of the material resistivity and the area of the exposed material. By measuring a number of these resistors and correlating the values given the length and width, a statistical determination can be made of any material variations, without changing the material by excessive etching.

The above described methods can provide significant advantages, examples of which will now be given. Prior LASER and annular resistor measurement processes require very expensive specific application equipment for processing. In one embodiment, the described methods require only a very low cost multi-meter. Both the LASER and the annular processes damage the material by cutting or over exposure of the material to etching solutions. The presently described methods can etch the material along the sides of the panel to fabricate the final circuits without affecting the area around the final embedded passive device. That is, the final product need not be etched or cut before making the final product. The time required and man hours spent trying to trim the embedded passive in the LASER process is very extensive. Each process of LASER etching requires on the order of 40 minutes for each resistor. The total time to LASER etch depends on the number of embedded devices. The time to measure as many as 5000 annular resistors can take on the order of 4 hours to measure just one panel. In certain embodiments, the above-described approach requires 10 minutes of measuring for a single panel. The LASER and annular processes require testing and repetitive shaping of the final device. The above-described process does not require repetitive shaping; the process can go from analysis to final embedded passive device for the circuit. There is no trimming or over etching required in the presently disclosed process. The simple method of making one or two resistors at the bottom or side of the boards is not statistically sound and errors are very large. In some embodiments, the above-described process needs only about thirty resistors on the bottom and side to achieve convergence of a statistically sound process and affect analysis. The present process can be practiced without over chemical etching or repetitively damaging the material around the final embedded device by LASER cutting. The present process may be performed without specialty equipment costing on the order of thousands of dollars as in the case of the LASER etching and annular resistor measurements. In some embodiments, the present process requires 10 minutes to determine the final area of the embedded passive device as opposed to four hours to measure five thousand resistors and forty minutes for a single LASER etched and cut resistor.

Creating square or rectangular resistors around the edges of the board, that are all connected together, allows the material under the copper strips leading to each of the resistors in the chain to effectively measure the variation without causing a discontinuity between the resistors along the bottom and sides. Prior processes generally do not allow for a continuous undisturbed measurement of the material. In the annular resistor case, each resistor in the order of two thousand resistors will break the material continuity by the fabrication of the resistors themselves. Thus, a string of undisturbed material in the area where the devices will be fabricated would become changed by the process itself. By etching the annular resistors, the material is altered by the mass fabrication of the devices. The etching solution is absorbed into the material, which creates the need for local area analysis of the board. Simply measuring one or two resistors around the board, as has also been done previously, is an inaccurate sample space to analyze the material. This is especially true for larger panels that produce more than one board with repetitive circuits.

The present process may be practiced without etching in the center of the panel, and thus not alter the material resistivity. In accordance with one embodiment, only a small portion of the top/bottom and sides of the panel are tested. These areas are normally waste areas in the fabrication process. Therefore the material in the areas of the final product is not altered by excessive etching.

While the invention has been particularly shown and described with reference to a preferred embodiment thereof, it will be understood by those skilled in the art that various changes in form and details may be made therein without departing from the spirit and scope of the invention.f

What is claimed is:

1. A method for fabricating a multi-layer printed circuit board containing embedded passive parts, comprising:
    performing a calibration step wherein a calibration measurement is taken of the geometry or at least one electrical parameter of an arrangement of calibration test points for one or more circuit forming processes;
    performing a process control step during the process, wherein a process control measurement is taken of at least one electrical parameter at one or more process control test points along one or more axes outside areas in which a circuit is to be formed;
    analyzing at least said calibration measurement and said process control measurement to calculate at least one CAD geometry change required to improve precision of embedded passive components to be printed on said multi-layer printed circuit board;
    modifying CAD geometry in accordance with the calculated CAD geometry change;
    manufacturing one or more multi-layer printed circuit boards containing embedded passive components in accordance with said modified CAD geometry.

2. The method for fabricating a multi-layer printed circuit board containing embedded passive parts according to claim 1, wherein said one or more axes outside areas in which a circuit is to be formed comprise a top axis and side axis perpendicular to said top axis.

3. The method for fabricating a multi-layer printed circuit board containing embedded passive parts according to claim 1, wherein said process control test points comprise resistors and said process control measurement comprises a resistance measurement.

4. The method for fabricating a multi-layer printed circuit board containing embedded passive parts according to claim 1, wherein said analyzing step utilizes CAD geometry, measured mask geometry, and measured etched resistor geometry.

5. The method for fabricating a multi-layer printed circuit board containing embedded passive parts according to claim 1, wherein said analyzing step models variability and adapts to it.

6. The method for fabricating a multi-layer printed circuit board containing embedded passive parts according to claim 1, wherein said analyzing step utilizes a learning model.

7. The method for fabricating a multi-layer printed circuit board containing embedded passive parts according to claim 1, wherein said analyzing step utilizes a neural network model.

8. The method for fabricating a multi-layer printed circuit board containing embedded passive parts according to claim 7, wherein said neural network model learns embedded passive material granular variation.

9. The method for fabricating a multi-layer printed circuit board containing embedded passive parts according to claim 7, wherein said neural network model learns etching process variation.

10. The method for fabricating a multi-layer printed circuit board containing embedded passive parts according to claim 9, wherein said etching process variation comprises puddle effects, etch undercut, or spray pattern obstructions.

11. The method for fabricating a multi-layer printed circuit board containing embedded passive parts according to claim 7, wherein said neural network model learns lamination stretching effects.

12. The method for fabricating a multi-layer printed circuit board containing embedded passive parts according to claim 7, wherein said neural network model learns a verification system.

13. The method for fabricating a multi-layer printed circuit board containing embedded passive parts according to claim 1, wherein said analyzing step utilizes a linear regression and a stochastic processing analysis.

14. The method for fabricating a multi-layer printed circuit board containing embedded passive parts according to claim 1, wherein said analyzing step utilizes a stochastic processing analysis.

15. The method for fabricating a multi-layer printed circuit board containing embedded passive parts according to claim 1, wherein said analyzing step utilizes matrix and linear algebra to determine a gradient and variation along a panel.

16. The method for fabricating a multi-layer printed circuit board containing embedded passive parts according to claim 6, wherein the learning model continues to learn and improve with subsequent batches of boards manufactured as information from process control test points and a normal component verification procedure after lamination is fed into it.

17. The method for fabricating a multi-layer printed circuit board containing embedded passive parts according to claim 1, wherein said one or more circuit forming processes comprise masking.

18. The method for fabricating a multi-layer printed circuit board containing embedded passive parts according to claim 1, wherein said one or more circuit forming processes comprise etching.

19. The method for fabricating a multi-layer printed circuit board containing embedded passive parts according to claim 1, wherein said one or more circuit forming processes comprise lamination.

20. The method for fabricating a multi-layer printed circuit board containing embedded passive parts according to claim 1, wherein said process control step comprises using a time or frequency domain reflectometer to take said process control measurement.

21. The method for fabricating a multi-layer printed circuit board containing embedded passive parts according to claim 1, wherein the calibration step comprises calibration of a masking step and includes quantifying variability between CAD geometry and actual printed mask geometry across the surface of a circuit board.

22. The method for fabricating a multi-layer printed circuit board containing embedded passive parts according to claim 1, wherein the calibration step comprises calibration of an etching step by quantifying variability between etch geometry and mask and CAD geometry.

23. The method for fabricating a multi-layer printed circuit board containing embedded passive parts according to claim 1, wherein the embedded passive components comprise resistors.

24. The method for fabricating a multi-layer printed circuit board containing embedded passive parts according to claim 1, wherein the embedded passive components comprise capacitors.

25. The method for fabricating a multi-layer printed circuit board containing embedded passive parts according to claim 1, wherein the embedded passive components comprise inductors.

26. The method for fabricating a multi-layer printed circuit board containing embedded passive parts according to claim 1, further comprising a step of drilling holes in a circuit card and adding vias to provide access to said embedded passive components.

\* \* \* \* \*